United States Patent
Tanaka

(10) Patent No.: US 7,609,739 B2
(45) Date of Patent: Oct. 27, 2009

(54) SEMICONDUCTOR LASER DEVICE

(75) Inventor: Akira Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/850,939

(22) Filed: Sep. 6, 2007

(65) Prior Publication Data

US 2008/0063019 A1  Mar. 13, 2008

(30) Foreign Application Priority Data

Sep. 6, 2006  (JP) .............................. 2006-241938

(51) Int. Cl.
*H01S 5/00* (2006.01)
(52) U.S. Cl. ................. 372/45.01; 372/43.01
(58) Field of Classification Search .............. 372/43.01, 372/45.01
See application file for complete search history.

(56) References Cited

U.S. PATENT DOCUMENTS 6,492,660 B2 * 12/2002 Uchida ..................... 257/79
6,891,189 B2 * 5/2005 Ito et al. ..................... 257/22
6,954,477 B2 * 10/2005 Uchida et al. ............ 372/43.01
7,015,053 B2   3/2006 Kozaki et al.
7,257,140 B2 * 8/2007 Yoneda .................... 372/46.01
2006/0209395 A1  9/2006 Sasaoka et al.

FOREIGN PATENT DOCUMENTS

JP  2002-299765  10/2002

* cited by examiner

*Primary Examiner*—Minsun Harvey
*Assistant Examiner*—Kinam Park
(74) *Attorney, Agent, or Firm*—Oblon, Spivak, McClelland, Maier & Neustadt, L.L.P.

(57) ABSTRACT

A semiconductor laser device includes: an active layer having a single or multiple quantum well structure including a well layer of $In_wGa_{1-w}N$ ($0.08 \leq w \leq 0.2$) and a barrier layer of $In_bGa_{1-b}N$ ($0.01 \leq b \leq 0.05$); a cladding layer of $Al_yGa_{1-y}N$ ($0 \leq y \leq 0.1$) provided on the active layer, the cladding layer including a ridge portion extending like a stripe in axial direction of an optical cavity and a non-ridge portion located on both sides of the ridge portion; and an overflow blocking layer of $Al_zGa_{1-z}N$ ($y<z$) provided between the active layer and the cladding layer. A thickness of D (μm) of the non-ridge portion and an axial length of L (μm) of the optical cavity satisfies formulas $L \geq 750-400 \times (D/0.01)$ and $0<D \leq 0.01$.

20 Claims, 4 Drawing Sheets

SEMICONDUCTOR LASER DEVICE

CROSS-REFERENCE TO RELATED APPLICATIONS

This application is based upon and claims the benefit of priority from the prior Japanese Patent Application No. 2006-241938, filed on Sep. 6, 2006; the entire contents of which are incorporated herein by reference.

BACKGROUND OF THE INVENTION

1. Field of the Invention
This invention relates to a semiconductor laser device.
2. Background Art
Blue-violet semiconductor laser devices for the 400 nm wavelength band are promising for application to the next-generation DVD (digital versatile disk). The recording capacity of the next-generation DVD is required to be 15 gigabytes or more on a one-sided, single-layer medium. To this end, the spot size needs to be smaller than in conventional DVDs. Furthermore, for rewriting in this wavelength band, the pulse light output is preferably 200 mW or more.

GaN-based semiconductor laser devices for this purpose needs to provide light output having a kink level of 200 mW (pulse power) or more and to realize a far field pattern (FFP) with less degradation of optical characteristics due to jitter and objective lens shift.

A patent document, JP-A 2002-299765 (Kokai), discloses a semiconductor laser device with a high kink level and a large full width at half maximum of horizontal FFP (Fh). In this document, the insulating film thickness, electrode film thickness, ridge height, and upper cladding layer thickness are configured so that the effective refractive index difference $\Delta n$ and the ridge width W are located within a particular $\Delta n \cdot W$ region. However, the teaching of this document is not yet sufficient for meeting the requirements of rewriting applications in the next-generation DVD.

SUMMARY OF THE INVENTION

According to an aspect of the invention, there is provided a semiconductor laser device including: an active layer having a single or multiple quantum well structure including a well layer of $In_wGa_{1-w}N$ ($0.08 \leq w \leq 0.2$) and a barrier layer of $In_bGa_{1-b}N$ ($0.01 \leq b \leq 0.05$); a cladding layer of $Al_yGa_{1-y}N$ ($0 \leq y \leq 0.1$) provided on the active layer, the cladding layer including a ridge portion extending like a stripe in axial direction of an optical cavity and a non-ridge portion located on both sides of the ridge portion; and an overflow blocking layer of $Al_zGa_{1-z}N$ ($y<z$) provided between the active layer and the cladding layer, a thickness of D (μm) of the non-ridge portion and an axial length of L (μm) of the optical cavity satisfying formulas $L \geq 750-400 \times (D/0.01)$ and $0 < D \leq 0.01$.

According to an aspect of the invention, there is provided a semiconductor laser device including: a first cladding layer including n-type AlGaN; a first light guide layer including GaN and provided on the first cladding layer; an active layer provided on the first light guide layer; an overflow blocking layer provided on the active layer; a second light guide layer including GaN and provided on the overflow blocking layer; a second cladding layer provided on the second light guide layer including a ridge portion extending like a stripe in axial direction of an optical cavity and a non-ridge portion located on both sides of the ridge portion; a contact layer including p+-type GaN provided on the ridge portion; an insulator layer provided on the both side faces of the ridge portion and the contact layer, and a upper face of the non-ridge portion, the active layer having a single or multiple quantum well structure including a well layer of $In_wGa_{1-w}N$ ($0.08 \leq w \leq 0.2$) and a barrier layer of $In_bGa_{1-b}N$ ($0.01 \leq b \leq 0.05$), the second cladding layer including $Al_yGa_{1-y}N$ ($0 \leq y \leq 0.1$), the overflow blocking layer including $Al_zGa_{1-z}N$ ($y<z$), and a thickness of D (μm) of the non-ridge portion and an axial length of L (μm) of the optical cavity satisfying formulas $L \geq 750-400 \times (D/0.01)$ and $0 < D \leq 0.01$.

According to an aspect of the invention, there is provided a semiconductor laser device including: a substrate having a first electrode on a first surface of the substrate; a first cladding layer including n-type AlGaN and provided on a second surface of the substrate; a first light guide layer including GaN and provided on the first cladding layer; an active layer provided on the first light guide layer; an overflow blocking layer provided on the active layer; a second light guide layer including GaN and provided on the overflow blocking layer; a second cladding layer provided on the second light guide layer including a ridge portion extending like a stripe in axial direction of an optical cavity and a non-ridge portion located on both sides of the ridge portion; a contact layer including p+-type GaN provided on the ridge portion; an insulator layer provided on the both side faces of the ridge portion and the contact layer, and a upper face of the non-ridge portion; and a second electrode provided on the contact layer and the insulator, the active layer having a single or multiple quantum well structure including a well layer of $In_wGa_{1-w}N$ ($0.08 \leq w \leq 0.2$) and a barrier layer of $In_bGa_{1-b}N$ ($0.01 \leq b \leq 0.05$), the cladding layer including $Al_yGa_{1-y}N$ ($0 \leq y \leq 0.1$), the overflow blocking layer including $Al_zGa_{1-z}N$ ($y<z$), and a thickness of D (μm) of the non-ridge portion and an axial length of L (μm) of the optical cavity satisfying formulas $L \geq 750-400 \times (D/0.01)$ and $0 < D \leq 0.01$.

DETAILED DESCRIPTION OF THE INVENTION

An embodiment of the invention will now be described with reference to the drawings.

Figure 1:
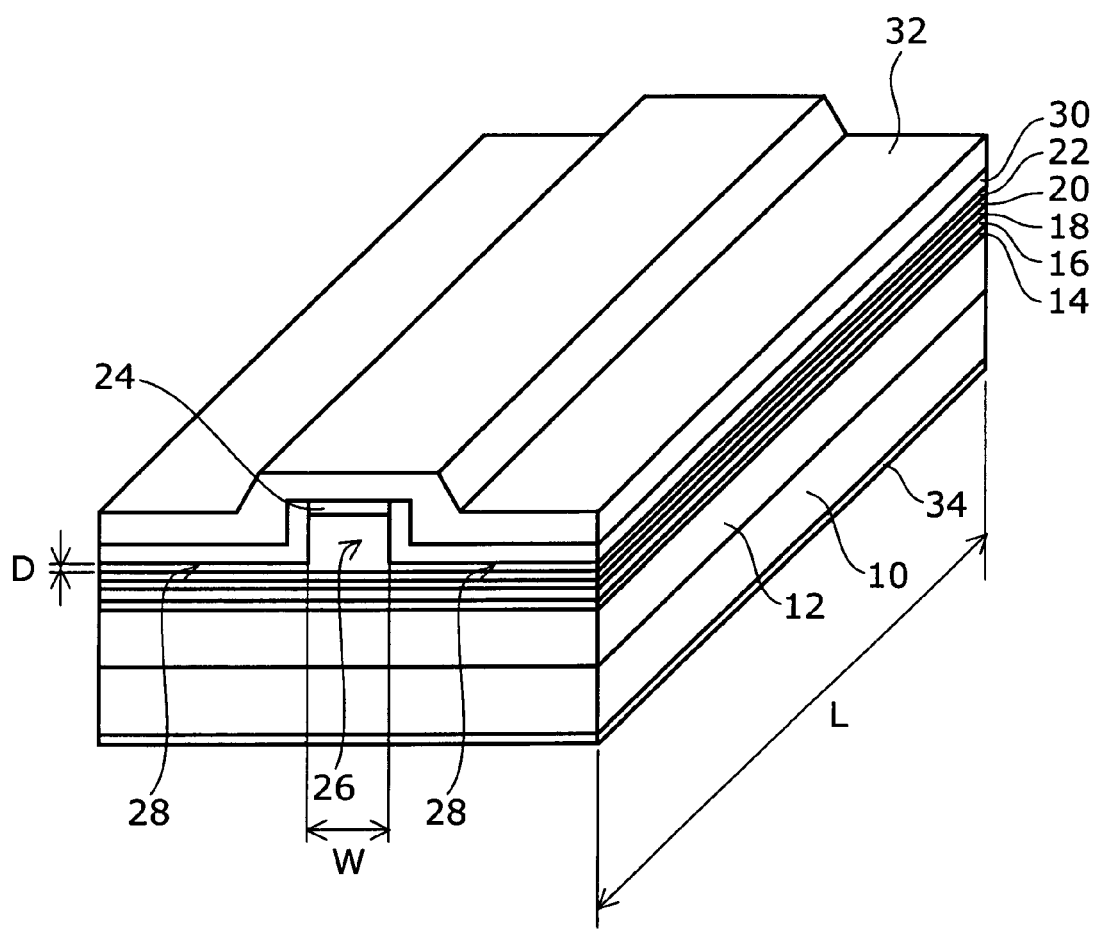
FIG. 1 is a schematic perspective view of a semiconductor laser device according to an example of the invention.

FIG. 1 is a schematic perspective view of a semiconductor laser device according to an example of the invention.

On a GaN substrate 10, an n-type AlGaN cladding layer 12, a GaN light guide layer 14, an active layer 16, a p-type overflow blocking layer 18, a GaN light guide layer 20, a p-type AlGaN cladding layer 22, and a p+-type GaN contact layer 24 are formed by crystal growth in this order. For crystal growth, MOCVD (metal-organic chemical vapor deposition) and MBE (molecular beam epitaxy) can be used.

The p-type AlGaN cladding layer 22 includes a ridge portion 26 having a width W and extending like a stripe in the axial direction of the optical cavity, and a non-ridge portion 28 located on both sides thereof. Both side faces of the ridge portion 26 and of the p+-type GaN contact layer 24 provided thereon, and the upper face of the non-ridge portion 28 are covered with an insulating film 30 of $SiO_2$. Furthermore, the insulating film 30 and the upper face of the p+-type GaN contact layer 24 are covered with a p-side electrode 32. On the other hand, an n-side electrode 34 is provided on the backside of the GaN substrate 10. Here, the width of the ridge portion 26 is denoted W (μm), the optical cavity length is denoted L (μm), and the thickness of the p-type AlGaN cladding layer 22 in the non-ridge portion 28 is denoted D (μm).

The cleaved, front-facet light emitting surface constituting the optical cavity is provided with a light reflecting film illustratively having a reflectivity of 10%. The light reflecting surface on the opposite facet is provided with a light reflecting film illustratively having a reflectivity of 95%.

This example is a so-called refractive index guided semiconductor laser device with horizontally controlled optical confinement. For example, in rewriting applications for 16× speed and other next-generation DVDs, it is preferable that the pulse light output be 200 mW or more, that is, the kink level be 200 mW or more. Furthermore, for improving characteristics with respect to objective lens shift and jitter, the full width at half maximum of horizontal FFP (Fh) is preferably 9.2° or more.

In general, if the effective refractive index difference Δn between the ridge portion 26 and the non-ridge portion 28 is increased, horizontal optical confinement is enhanced, and Fh can be increased while the kink level decreases. In this example, Δn is increased within the range meeting the required specification of Fh, and the resulting decrease of kink level is improved by increasing the cavity length L.

Next, the laminated body formed by crystal growth is described in detail.

The n-type $Al_xGa_{1-x}N$ (0≦x≦0.1) cladding layer 12 has a thickness of e.g. 1.5 μm, and the n-type GaN light guide layer 14 has a thickness of e.g. 0.07 μm. The active layer 16 has a single or multiple quantum well structure composed of a well layer of $In_wGa_{1-w}N$ (0.08≦w≦0.2) and a barrier layer of $In_bGa_{1-b}N$ (0.01≦b≦0.05). The GaN light guide layer 20 has a thickness of e.g. 0.03 μm. The p-type AlGaN cladding layer 22 is made of $Al_yGa_{1-y}N$ (0≦y≦0.1) and has a thickness of e.g. 0.45 μm at the ridge portion 26. The p+-type GaN contact layer 24 has a thickness of e.g. 0.1 μm.

The p-type overflow blocking layer 18 provided between the active layer 16 and the GaN light guide layer 20 is made of $Al_zGa_{1-z}N$ (y<z) and has a thickness of e.g. 0.01 μm. In a nitride semiconductor laser device, it is important to prevent carriers not recombined in the active layer 16 from leaking into the p-type AlGaN cladding layer 22. By setting the aluminum composition ratio z in the p-type overflow blocking layer 18 to approximately 0.2, which is larger than the composition ratio y in the p-type AlGaN cladding, the bandgap can be widened, and carrier leakage can be reduced. Furthermore, by setting the acceptor concentration in the p-type overflow blocking layer 18 to e.g. $1 \times 10^{20}$ $cm^{-3}$ or more, the heterobarrier on the conduction band side at the interface with the active layer 16 is increased. Consequently, electron overflow can be further reduced.

However, the aluminum composition ratio as high as 0.2 results in low refractive index. That is, because the refractive index of the p-type overflow blocking layer 18 becomes lower than that of the p-type GaN light guide layer 20 and the p-type AlGaN cladding layer 22, vertical optical confinement is enhanced. Consequently, the guided modes are more likely to spread horizontally.

Figure 2:
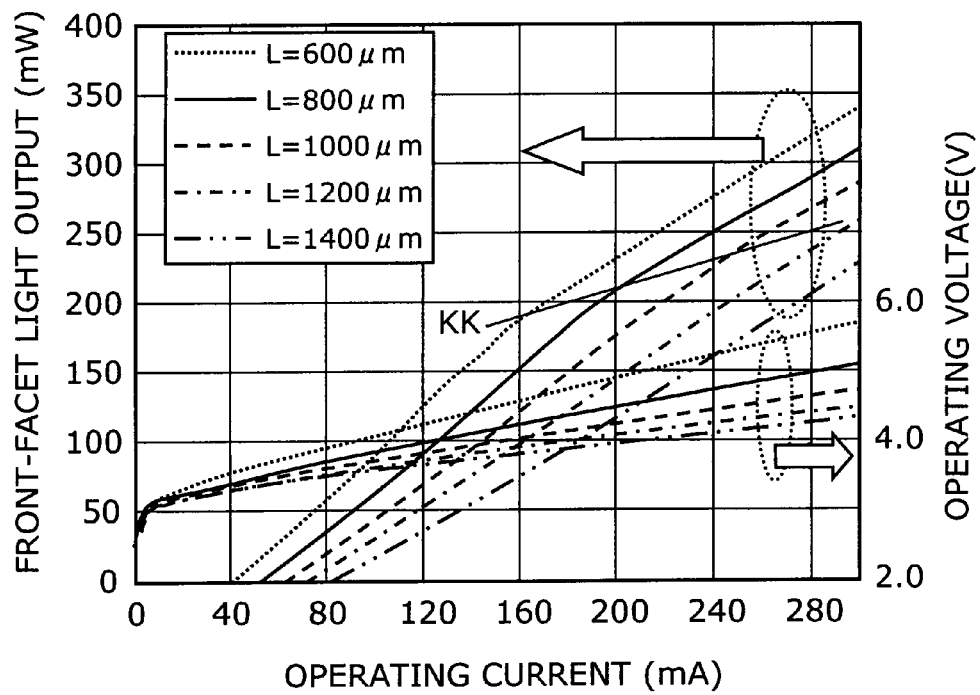
FIG. 2 is a graph showing a simulation result for the operating current dependence of front-facet light output and operating voltage in a semiconductor device according to an example.

FIG. 2 is a graph showing a simulation result for the operating current dependence of front-facet light output and of operating voltage. The vertical axis represents front-facet light output (mW) and operating voltage (V), and the horizontal axis represents operating current (mA).

Here, the width W of the ridge portion 26 is 2.0 μm, and the thickness D of the non-ridge portion 28 is 0.01 μm. The cavity length L is selected to be 600 μm (dotted line), 800 μm (solid line), 1000 μm (dashed line), 1200 μm (single dot dashed line), and 1400 μm (double dot dashed line). While D is as minute as 0.01 μm, such processing accuracy is feasible. The ridge portion 26 can be formed by RIE (reactive ion etching). In this case, etching can be performed accurately up to the vicinity of the GaN light guide layer 20 by using the active layer 16 to monitor the etching endpoint. Here, if the GaN light guide layer 20 is etched, optical confinement is significantly affected. Hence the non-ridge portion 28 is preferably left in the range of 0≦D≦0.01 μm.

The kink level, which is represented as a kink in front-facet light output, is 180 mW for L=600 μm, 200 mW for L=800 μm, and 230 mW for L=1000 μm. Thus, with the increase of the cavity length L, the kink level can be increased almost linearly as indicated by KK. The operating voltage for an operating current of 200 mA is 5.9 V for L=600 μm, 4.5 V for L=800 μm, 4.2 V for L=1000 μm, and 3.9 V for L=1400 μm. Thus the operating voltage can be reduced with the increase of L.

Figure 3:
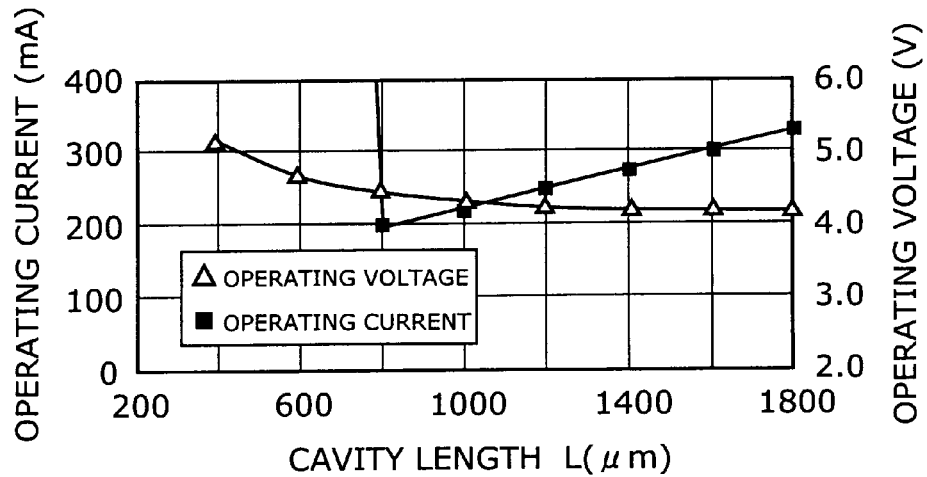
FIG. 3 is a graph showing the cavity length dependence of operating current and operating voltage in a semiconductor laser device according to an example.

FIG. 3 is a graph showing the cavity length dependence of operating current and operating voltage for W=2.0 μm. The vertical axis represents operating current (mA) and operating voltage (V), and the horizontal axis represents cavity length L (μm).

The operating current is nearly minimized to approximately 200 mA when the cavity length is in the vicinity of 800 μm. As the cavity length L increases, the operating current increases almost linearly. In this case, the kink level can also be increased as illustrated in FIG. 2. The operating voltage decreases as the cavity length L increases. However, above 1600 μm, the operating voltage is nearly constant at 4.1 V and scarcely decreases.

As illustrated in FIGS. 2 and 3, for W=2.0 μm, the range of L≧800 μm is preferable, where the kink level can be set to 200 mW or more and the operating voltage can be set to 4.3 V or less. As L is increased, the kink level can be increased, but the operating current increases. Hence it is preferable to make an appropriate selection depending on the power supply for the optical disk driver. The cavity length depends also on the thickness D of the non-ridge portion 28, and this will be described later in detail.

Next, a comparative example is described.

In the comparative example, the width of the ridge portion 26 is set to W=2.0 μm, and the cavity length is set to L=600 μm.

Figure 4:
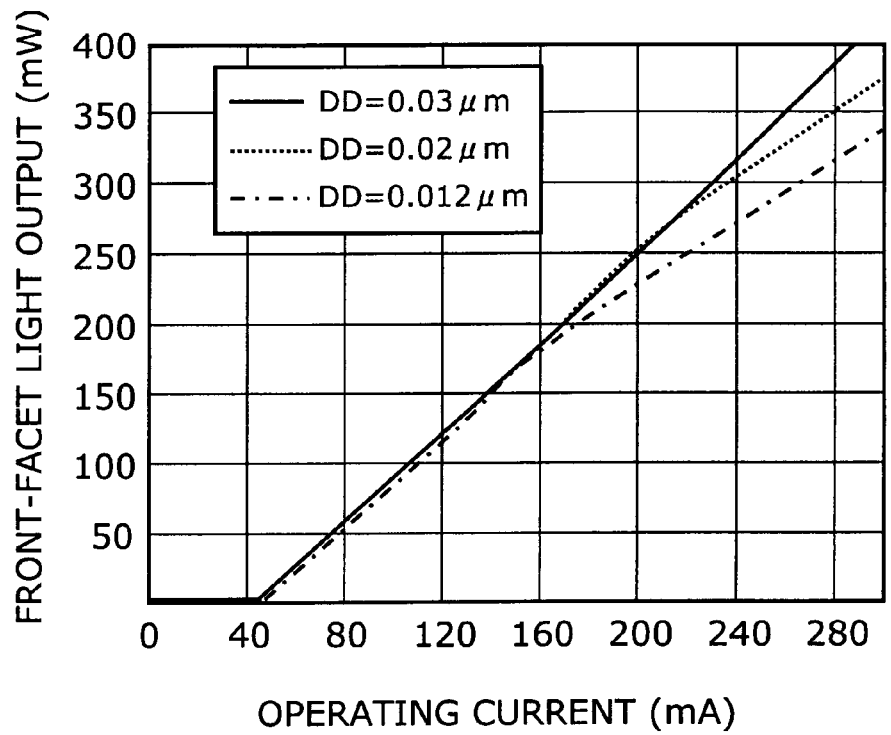
FIG. 4 is a graph showing a simulation result for the operating current dependence of front-facet light output in the comparative example.

FIG. 4 is a graph showing a simulation result for the operating current dependence of front-facet light output in the comparative example. The vertical axis represents front-facet light output (mW), and the horizontal axis represents operating current (mA).

The thickness D of the non-ridge portion 28 is set to 0.012 μm (single dot dashed line), 0.02 μm (dotted line), and 0.03 μm (solid line). For D=0.012 μm, the kink level is 180 mW. The kink level can be increased, that is, 280 mW for D=0.02 μm, and 380 mW or more for D≧0.03 μm. Here, as D increases, the horizontal effective refractive index difference Δn between the ridge portion 26 and the non-ridge portion 28 decreases. This results in weakening optical confinement and improving the kink level.

Figure 5:
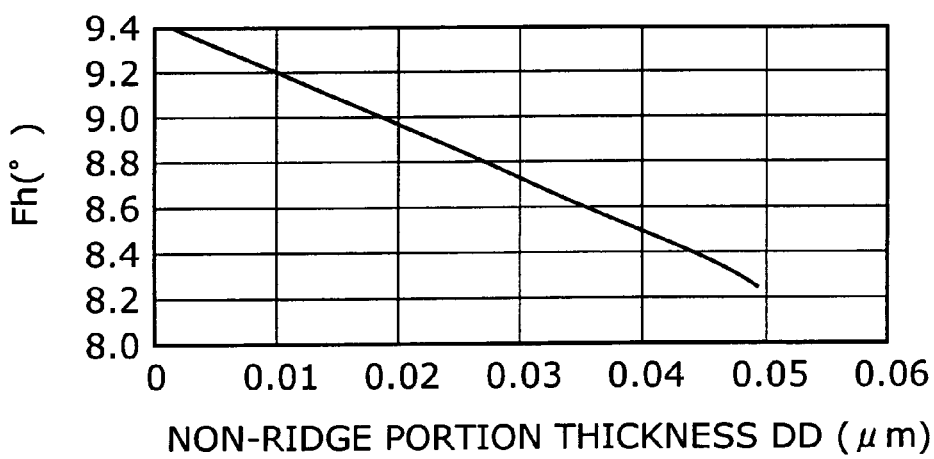
FIG. 5 is a graph showing a simulation result for dependence of full width at half maximum of horizontal FFP (Fh) on the thickness of the non-ridge portion in the comparative example.

On the other hand, FIG. 5 is a graph showing a simulation result for the dependence of full width at half maximum of horizontal FFP (Fh) on the thickness D of the non-ridge portion 28 in the comparative example. The vertical axis represents Fh (°), and the horizontal axis represents the thickness D (μm) of the non-ridge portion 28.

The graph indicates that Fh=9.2° for D=0.01 μm, Fh=8.72° for D=0.03 μm, and Fh=8.22° for D=0.05 μm. As D increases, Δn decreases, horizontal optical confinement is weakened, and Fh decreases. This results in increased aspect ratio, which is undesirable for optical characteristics of the next-generation DVD.

Furthermore, because the p-type overflow blocking layer 18 has a large aluminum composition ratio, it has a small refractive index, which enhances vertical optical confinement. Consequently, the guided modes are more likely to spread horizontally. Furthermore, a large thickness D of the non-ridge portion 28 is undesirable because the current spreads horizontally and the lasing threshold current increases.

In contrast, in the present example, horizontal current spreading is prevented by etching to D≦0.01 μm, and optical characteristics are improved by setting Fh=9.2°. Furthermore, appropriate selection of the cavity length L allows improvement of kink level and reduction of operating voltage. If Fh<9.2° as in the comparative example, optical characteristics with respect to objective lens shift and jitter are degraded and may fail to sufficiently meet the next-generation DVD specification. On the other hand, if Fh is too large, the light capturing efficiency of the condensing lens decreases. Hence Fh is preferably 9.2° or more and 11° or less. The full width at half maximum- of vertical FFP (Fv) is preferably 17° or more and 23° or less for focusing the spot. From the foregoing, the aspect ratio (=Fv/Fh) is preferably 1.54 or more and 2.5 or less.

In the comparative example with D=0.012 μm, the kink level is 180 mW as illustrated in FIG. 4, which fails to sufficiently meet the light output specification of the next-generation DVD. In contrast, in the present example, the kink level can be improved by setting D≦0.01 μm and appropriately selecting the cavity length L depending on D.

Figure 6:
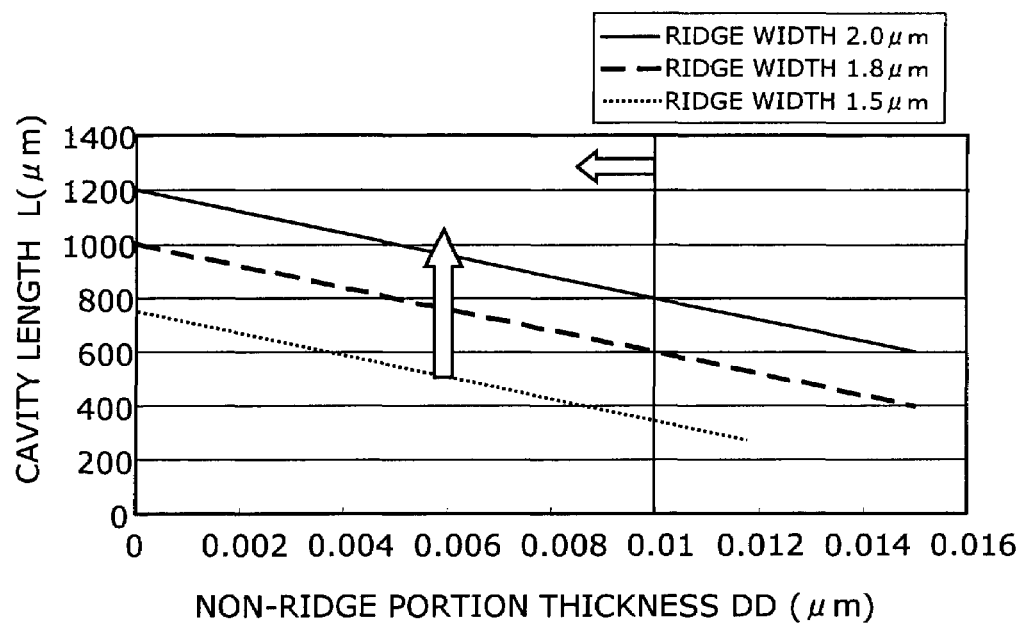
FIG. 6 is a graph showing a simulation result for the relationship between the cavity length realizing a kink level of 200 mW and the thickness of the non-ridge portion.

FIG. 6 is a graph showing a simulation result for the relationship between the cavity length L realizing a kink level of 200 mW and the thickness D of the non-ridge portion 28. The vertical axis represents the cavity length L (μm), and the horizontal axis represents the non-ridge portion thickness D (μm).

As shown in FIG. 6, an almost linear relationship holds between D and L. The solid line represents the ridge width W=2.0 μm, the dashed line represents W=1.8 μm, and the dotted line represents W=1.5 μm.

The kink level decreases as W increases, and the resistance increases as W decreases. Hence the range of 1.5 μm≦W≦2.5 μm is preferable. For example, when W is equal to 1.5 μm, which is the lower limit of the width of the ridge portion 26, the kink level can be set to 200 mW or more by a combination of L and D expressed by the formula: cavity length L≧750−400×(D/0.01). When W=1.8 μm or less, the kink level can be set to 200 mW or more by a combination of L and D expressed by the formula: L≧1000−400×(D/0.01). Furthermore, when W=2.0 μm or less, the kink level can be set to 200 mW or more by a combination of L and D expressed by the formula: L≧1200−400×(D/0.01). The upper limit of L can be set to 1600 μm, where the increase of L scarcely contributes to the reduction of operating voltage. As described earlier, D≦0.01 μm is preferable for Fh≧9.2°.

The present example can thus realize a semiconductor laser device for the 400 nm wavelength band with improved kink level, having a pulse light output of e.g. 200 mW or more, and having good characteristics with respect to objective lens shift and jitter. This allows a storage capacity of 15 gigabytes or more on a one-sided, single-layer medium, and allows rewriting for the next-generation DVD.

The embodiment of the invention has been described with reference to the drawings. However, the invention is not limited to the above example.

For instance, the material, shape, size, and arrangement of the substrate, compound semiconductor multilayer film, electrode, ridge portion, and non-ridge portion constituting the semiconductor laser device can be variously modified by those skilled in the art, and such modifications are also encompassed within the scope of the invention as long as they do not depart from the spirit of the invention.

The invention claimed is:

1. A semiconductor laser device, comprising:
an active layer having a single or multiple quantum well structure including a well layer of $In_wGa_{1-w}N$ (0.08≦w≦0.2) and a barrier layer of $In_bGa_{1-b}N$ (0.01≦b≦0.05);
a cladding layer of $Al_yGa_{1-y}N$ (0≦y≦0.1) provided on the active layer, the cladding layer including a ridge portion extending like a stripe in axial direction of an optical cavity and a non-ridge portion located on both sides of the ridge portion; and
an overflow blocking layer of $Al_zGa_{1-z}N$ (y<z) provided between the active layer and the cladding layer,
a thickness of D (μm) of the non-ridge portion and an axial length of L (μm) of the optical cavity satisfying formulas $L≧750−400×(D/0.01)$ and $0<D≦0.01,$ wherein a full width at half maximum of a horizontal far field pattern of a beam emitted from the active layer has a width of not less than 9.2 degrees.

2. The semiconductor laser device according to claim 1, wherein the overflow blocking layer has an acceptor concentration of $1×10^{20}$ cm$^{-3}$ or more.

3. The semiconductor laser device according to claim 1, wherein the ridge portion has a width of not less than 1.5 μm and not more than 2.5 μm.

4. The semiconductor laser device according to claim 1, wherein the ridge portion has a width of not more than 2.0 μm, and a formula $L≦1200−400×(D/0.01)$ is satisfied.

5. The semiconductor laser device according to claim 1, wherein the ridge portion has a width of not more than 1.8 μm, and a formula $L≧1000−400×(D/0.01)$ is satisfied.

6. The semiconductor laser device according to claim 1, wherein a full width at half maximum of the horizontal far field pattern of a beam emitted from the active layer has a width of not more than 11 degrees.

7. The semiconductor laser device according to claim 1, wherein a full width at half maximum of a vertical far field pattern of a beam emitted from the active layer has a width of not less than 17 degrees and not more than 23 degrees.

8. The semiconductor laser device according to claim 1, wherein a ratio of a full width at half maximum of the vertical far field pattern to a full width at half maximum of the horizontal far field pattern of a beam emitted from the active layer has a width of not less than 1.54 and not more than 2.5.

9. A semiconductor laser device, comprising:
a first cladding layer including n-type AlGaN;
a first light guide layer including GaN and provided on the first cladding layer;
an active layer provided on the first light guide layer;
an overflow blocking layer provided on the active layer;
a second light guide layer including GaN and provided on the overflow blocking layer;
a second cladding layer provided on the second light guide layer including a ridge portion extending like a stripe in axial direction of an optical cavity and a non-ridge portion located on both sides of the ridge portion;
a contact layer including $p^+$-type GaN and provided on the ridge portion; and
an insulator layer provided on the both side faces of the ridge portion and the contact layer, and a upper face of the non-ridge portion,
the active layer having a single or multiple quantum well structure including a well layer of $In_wGa_{1-w}N$ ($0.08 \leq w \leq 0.2$) and a barrier layer of $In_bGa_{1-b}N$ ($0.01 \leq b \leq 0.05$),
the second cladding layer including $Al_yGa_{1-y}N$ ($0 \leq y \leq 0.1$),
the overflow blocking layer including $Al_zGa_{1-z}N$ ($y<z$), and
a thickness of D (μm) of the non-ridge portion and an axial length of L (μm) of the optical cavity satisfying formulas $L \geq 750-400 \times (D/0.01)$ and $0 < D \leq 0.01$, wherein a full width at half maximum of a horizontal far field pattern of a beam emitted from the active layer has a width of not less than 9.2 degrees.

10. The semiconductor laser device according to claim 9, wherein the overflow blocking layer has an acceptor concentration of $1 \times 10^{20}$ cm$^{-3}$ or more.

11. The semiconductor laser device according to claim 9, wherein the ridge portion has a width of not less than 1.5 μm and not more than 2.5 μm.

12. The semiconductor laser device according to claim 9, wherein the ridge portion has a width of not more than 2.0 μm, and a formula $L \geq 1200-400 \times (D/0.01)$ is satisfied.

13. The semiconductor laser device according to claim 9, wherein the ridge portion has a width of not more than 1.8 μm, and a formula $L \geq 1000-400 \times (D/0.01)$ is satisfied.

14. The semiconductor laser device according to claim 9, wherein a full width at half maximum of the horizontal far field pattern of a beam emitted from the active layer has a width of not more than 11 degrees.

15. The semiconductor laser device according to claim 9, wherein a full width at half maximum of a vertical far field pattern of a beam emitted from the active layer has a width of not less than 17 degrees and not more than 23 degrees.

16. A semiconductor laser devices comprising:
a substrate having a first electrode on a first surface of the substrate;
a first cladding layer including n-type AlGaN and provided on a second surface of the substrate;
a first light guide layer including GaN and provided on the first cladding layer;
an active layer provided on the first light guide layer;
an overflow blocking layer provided on the active layer;
a second light guide layer including GaN and provided on the overflow blocking layer;
a second cladding layer provided on the second light guide layer including a ridge portion extending like a stripe in axial direction of an optical cavity and a non-ridge portion located on both sides of the ridge portion;
a contact layer including $p^+$-type GaN provided on the ridge portion;
an insulator layer provided on the both side faces of the ridge portion and the contact layer, and a upper face of the non-ridge portion; and
a second electrode provided on the contact layer and the insulator,
the active layer having a single or multiple quantum well structure including a well layer of $In_wGa_{1-w}N$ ($0.08 \leq w \leq 0.2$) and a barrier layer of $In_bGa_{1-b}N$ ($0.01 \leq b \leq 0.05$),
the cladding layer including $Al_yGa_{1-y}N$ ($0 \leq y \leq 0.1$),
the overflow blocking layer including $Al_zGa_{1-z}N$ ($y<z$), and
a thickness of D (μm) of the non-ridge portion and an axial length of L (μm) of the optical cavity satisfying formulas $L \geq 750-400 \times (D/0.01)$ and $0 < D \leq 0.01$, wherein a full width at half maximum of a horizontal far field pattern of a beam emitted from the active layer has a width of not less than 9.2 degrees.

17. The semiconductor laser device according to claim 16, wherein the overflow blocking layer has an acceptor concentration of $1 \times 10^{20}$ cm$^{-3}$ or more.

18. The semiconductor laser device according to claim 16, wherein the ridge portion has a width of not less than b 1.5 μm and not more than 2.5 μm.

19. The semiconductor laser device according to claim 16, wherein the ridge portion has a width of not more than 2.0 μm, and a formula $L \geq 1200-400 \times (D/0.01)$ is satisfied.

20. The semiconductor laser device according to claim 16, wherein the ridge portion has a width of not more than 1.8 μm, and a formula $L \geq 1000-400 \times (D/0.01)$ is satisfied.

* * * * *